(12) United States Patent
Tamagaki et al.

(10) Patent No.: US 7,156,046 B2
(45) Date of Patent: Jan. 2, 2007

(54) PLASMA CVD APPARATUS

(75) Inventors: Hiroshi Tamagaki, Takasago (JP);
Tadao Okimoto, Takasago (JP); Hideki Yutaka, Takasago (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 107 days.

(21) Appl. No.: 10/450,788

(22) PCT Filed: Jun. 5, 2002

(86) PCT No.: PCT/JP02/05566

§ 371 (c)(1),
(2), (4) Date: Jun. 18, 2003

(87) PCT Pub. No.: WO02/103079

PCT Pub. Date: Dec. 27, 2002

(65) Prior Publication Data

US 2004/0045508 A1    Mar. 11, 2004

(30) Foreign Application Priority Data

Jun. 14, 2001    (JP)    ............................. 2001-180686

(51) Int. Cl.
*C23C 16/00* (2006.01)
*C23F 1/00* (2006.01)
*H01L 21/306* (2006.01)
*H01J 7/24* (2006.01)
*H05B 31/26* (2006.01)

(52) U.S. Cl. .................. 118/723 MW; 156/345.41; 156/345.42; 118/723 ME; 118/723 MA; 118/723 MR; 118/723 AN; 315/111.21; 315/111.51; 315/111.81

(58) Field of Classification Search ........... 156/345.41, 156/345.42; 118/723 MW, 723 MR, 723 MA; 315/111.21, 111.51, 111.41; 204/298.38; 333/99 PL; 343/786
See application file for complete search history.

(56) References Cited

U.S. PATENT DOCUMENTS

| | | | | |
|---|---|---|---|---|
| 3,985,851 A | * | 10/1976 | MacTurk | ..................... 264/104 |
| 4,714,589 A | * | 12/1987 | Auwerda et al. | ........... 427/573 |
| 4,844,007 A | * | 7/1989 | Eikelboom | .......... 118/723 MW |
| 4,944,244 A | * | 7/1990 | Moisan et al. | ...... 118/723 MW |

(Continued)

FOREIGN PATENT DOCUMENTS

EP    554845    8/1993

(Continued)

OTHER PUBLICATIONS

Andies H. Van Vergen et al.: "PCVD: The ultimate technology for production of high bandwidth multimode fibres" International Wire and Cable Symposium Proceedings, vol. 47th, pp. 66-72 1998.

(Continued)

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, P.C.

(57) ABSTRACT

A plasma CVD apparatus in which microwave power is supplied into a reaction chamber provided inside an annular waveguide through an antenna provided on the inner peripheral part of the waveguide to produce a plasma inside the reaction chamber and to form a film by a vapor growth synthesizing method. A cooler is disposed between the annular waveguide and the reaction chamber to maintain the low temperature of the annular waveguide.

35 Claims, 14 Drawing Sheets

U.S. PATENT DOCUMENTS

| | | | |
|---|---|---|---|
| 5,114,770 A | | 5/1992 | Echizen et al. |
| 5,389,153 A | * | 2/1995 | Paranjpe et al. ...... 118/723 MP |
| 5,517,085 A | * | 5/1996 | Engemann et al. ...... 315/111.21 |
| 5,565,738 A | * | 10/1996 | Samukawa et al. ...... 315/111.51 |
| 6,138,478 A | * | 10/2000 | Neuberger et al. ............ 65/391 |
| 6,369,493 B1 | * | 4/2002 | Lubomirsky et al. .. 313/231.31 |
| 6,399,411 B1 | * | 6/2002 | Hori et al. .................... 438/62 |
| 6,404,402 B1 | * | 6/2002 | Koh et al. .................. 343/786 |
| 6,670,741 B1 | * | 12/2003 | Ishii ...................... 313/231.31 |
| 2004/0164058 A1 | * | 8/2004 | Sanders et al. ........ 219/121.39 |

FOREIGN PATENT DOCUMENTS

| | | |
|---|---|---|
| JP | 9-87851 | 3/1997 |
| JP | 2886752 | 2/1999 |
| JP | 2001-200369 | 7/2001 |
| WO | 99/35304 | 7/1999 |

OTHER PUBLICATIONS

"Surface modifying technique-dry process there of" pp. 60-63 1988.

* cited by examiner

PLASMA CVD APPARATUS

FIELD OF ART

The present invention relates to a plasma-activated CVD system.

BACKGROUND ART

The following conventional methods are known as a plasma-activated CVD (chemical vapor deposition) method wherein a gaseous mixture is fed into a reaction chamber disposed inside an annular waveguide, a microwave power is fed from an antenna installed in an inner periphery portion of the waveguide, causing plasma to be generated within the reaction chamber, and a film is formed by a vapor growth synthesis method.

Prior Art 1

There has been known a method wherein, as a material of optical fiber having a core layer and a clad layer different in refractive index, a film is formed on an inner surface of a cylindrical quartz tube by a plasma-activated CVD method. As a plasma-activated CVD system for forming such a material there is known one which is described on pages 66~72 of "International Wire & Cable Symposium Proceeding 1998."

According to this known art, a substrate tube is disposed inside an annular waveguide (resonator), the substrate tube being constituted by a quartz tube, an internal pressure of the quartz tube is reduced to a predetermined pressure by means of a vacuum pump, and a desired gaseous mixture, e.g., a gaseous mixture of $SiCl_4$, $GeCl_4$, $C_2F_6$, and $O_2$ is fed at a specific low pressure into the tube.

Spots are formed in an inner periphery surface of the annular waveguide at predetermined intervals in the circumferential direction, and through the spots electromagnetic power of a microwave acting at 2.45 GHz is fed to the quartz tube. Plasma is generated within the quartz tube (substrate tube) and with this plasma a desired gas component is vapordeposited on the inner wall of the substrate tube.

The temperature of the substrate tube (quartz tube) during vapor deposition is maintained at about 1200° C. by means of a furnace which covers the whole of the system, and the substrate tube itself is made rotatable. Further, the substrate tube and the annular waveguide are movable relatively in the axial direction. The annular waveguide is provided with a cooler.

Prior Art 2

On pages 60~63 of "Surface Modifying Technique" Dry Process and Application Thereof (The Nikkan Kogyo Shinbun Ltd., published Sep. 30, 1988) there is disclosed a system wherein plasma is generated in the interior of a quartz tube.

More particularly, a plasma-activated CVD system using a microwave as an excitation source is disclosed therein, in which a reaction chamber is constituted by a quartz glass tube 40~50 mm in diameter and a substrate holding tray is disposed centrally. A microwave (2,450 mHz) passes through an isolator, a power monitor and a microwave matching tuner and is conducted by a waveguide into the reaction chamber. Feed gas is introduced from an upper portion of the reaction chamber and is discharged from a lower portion of the same chamber. Since the pressure is normally several ten Torr, even an oil rotary pump alone suffices. The substrate temperature can be maintained at an appropriate value by suitably selecting a gas pressure, a microwave power, and a substrate holder material. But auxiliary heating and cooling may be done as necessary.

Prior Art 3

In the specification of U.S. Pat. No. 5,517,085 there is disclosed a plasma generating system comprising a ring resonator as an annular waveguide with slot antennas arranged in an inner periphery surface of the resonator at predetermined intervals in the circumferential direction and a cylindrical quartz tube inserted into the ring resonator. As a slot antenna there is disclosed therein a pyramidal electromagnetic horn antenna having a wider opening area toward the reaction chamber.

In case of depositing, for example, a silica-based material in the inner wall of a quartz tube of an optical fiber preform by plasma-activated CVD, it is necessary to heat the quartz tube to a high temperature. According to the prior art 1, the temperature of the quartz tube sometimes reaches 1200° C. though it also depends on the contents of a process adopted.

In case of using the method of the prior art 1 in such a high-temperature process, the annular waveguide receives radiant heat from the quartz tube mainly at is surface opposed to the quartz tube and its temperature is likely to become high.

In the prior art 1, the annular waveguide has a water cooling structure, but the cooling portion is the side wall portion of the annular waveguide and the inner periphery surface side opposed to the high temperature quartz tube is not cooled, so that a temperature rise on the inner surface side is unavoidable.

Electromagnetic power of a microwave is propagated in the interior of the annular waveguide, but the characteristic of the propagation depends strongly on the electric resistance of the inner surface of the annular waveguide. As the temperature of the waveguide becomes high, the surface resistance increases and hence the propagation loss of the microwave increases. Further, if the oxygen in air and the waveguide material react with each other due to a high heat to form an oxide film on the surface of the waveguide, the surface resistance will increase to a remarkable extent.

For example, if the waveguide temperature increases from 0° C. to 1200° C., a principal metal surface resistance becomes about 3.5 times as much. Within the waveguide, an electromagnetic wave is propagated while producing an electric current on the waveguide surface. Thus, an electric resistance of the inner surface of the waveguide has a great influence and the loss by the waveguide becomes about 3.5 times as much. Further, if the influence of surface oxidation based on temperature is also taken into account, the loss by the waveguide becomes large to an unignorable extent.

When the loss by the waveguide becomes large, not only the microwave supply efficiency is deteriorated in proportion to the loss, but also the waveguide itself becomes a heat generating element due to Joule heat at the waveguide surface induced by the microwave propagation. This leads to a vicious cycle comprising a further lowering of propagation efficiency in the waveguide, an increase of loss, and the generation of Joule heat. Under such a vicious cycle, coupled with the influence of oxidation of the waveguide surface, the waveguide will undergo a fatal damage.

Even in the case where the waveguide is not mechanically damaged, an increase in electrical loss of the waveguide will give rise to an inconvenience such as a lowering of the microwave output.

At the stage before plasma ignition with plasma not produced yet, the amount of microwave leaking from slots is small, so that the loss of the microwave resonant circuit constituted by the annular waveguide is greatly dominated by Joule heat produced within the waveguide. Therefore, in the case where the internal loss of the annular waveguide is large, a performance deterioration such as the deterioration of ignition characteristic will result.

Thus, for ensuring a satisfactory microwave propagation characteristic in the annular waveguide, it is necessary that the electric conductivity in the interior of the waveguide be maintained in a satisfactory condition, and hence it is necessary to keep the temperature low.

Accordingly, it is an object of the present invention to provide a plasma-activated CVD system wherein the temperature of an annular waveguide is kept low.

DISCLOSURE OF THE INVENTION

For achieving the above-mentioned object the present invention has adopted the following means. That is, a feature of the present invention resides in a plasma-activated CVD system wherein electromagnetic power of a microwave is fed from antennas provided in an inner periphery portion of an annular waveguide into a reaction chamber disposed inside the waveguide, allowing plasma to be generated in the interior of the reaction chamber, and a film is formed by a vapor growth synthesis method, with a cooler being disposed between the annular waveguide and the reaction chamber.

According to the construction of the present invention, heat from the reaction chamber, etc. can be released to the exterior by the cooler, therefore, an inner surface of the waveguide can be protected against high temperatures and it is possible to attain a safe and stable supply of microwave.

In the present invention, preferably, the antennas are constituted by slots formed in the inner periphery portion of the annular waveguide at predetermined intervals in the circumferential direction, and the cooler is disposed between adjacent such slot antennas on the inner periphery portion of the annular waveguide.

In this construction, the radiation of microwave from the antennas is not obstructed.

More particularly, for stable radiation of a microwave from the antennas it is considered necessary to match characteristic impedance to a satisfactory extent on both waveguide side and reaction chamber side of the antennas. The characteristic impedance on the reaction chamber side depends much on a spatial electromagnetic field distribution in the vicinity of each antenna and undergoes a change if especially a metallic member is present near the antenna.

Particularly, in the case where the cooler is carelessly fabricated by a conductor such as metal, the conductor of the cooler affects a microwave electromagnetic field radiated from each slot, resulting in that the microwave radiation efficiency is deteriorated.

In the present invention, in view of the above point, the cooler is disposed between adjacent slots.

For stabilizing and uniforming an electromagnetic field in the space surrounded with both reaction chamber and annular waveguide, it may be effective to embed the cooler in the inner periphery wall of the annular waveguide. In this case, however, the thickness of the inner periphery wall becomes larger. If slots are formed in such a thicker wall, there arises the necessity for the microwave in each slot to be propagated a long distance through a narrower gap than wavelength. As a result, it becomes difficult to take the foregoing characteristic impedance matching, and the microwave is reflected at the position of each slot and is returned to the annular waveguide. Thus, the microwave becomes difficult to be radiated to the reaction chamber.

In view of this point it is preferable in the present invention that the antennas be constituted as electromagnetic horn antennas in each of which an spot area of the associated slot is wider toward the reaction chamber.

This construction permits an improvement of the microwave radiation efficiency.

In more particular terms, since the electromagnetic horns are each divergent in its spot area from the associated slot, they function to approximate the characteristic impedance gradually from the impedance in the interior of the waveguide to the characteristic impedance and finally match the characteristic impedance between the slots formed in the waveguide and the space. With such means, it is possible to ensure a stable supply of a microwave.

It is preferable that the electromagnetic horn antennas be in a pyramidal shape, which shape permits easier fabrication of the antennas.

It is preferable that a vertical angle of the cone of each pyramidal electromagnetic horn antenna be in the range of 30° to 90°, more preferably 50° to 60°.

Generally, the smaller the vertical angle of each electromagnetic horn, the more gradual the change of impedance and the higher the microwave release efficiency. However, since the length of each horn, i.e., the thickness of the inner periphery wall of the waveguide is limited, it is impossible to make the spot area large and the antenna loss becomes high. That is, if the vertical angle is set too small, the microwave becomes difficult to be propagated and most microwave is reflected into the annular waveguide, not released to the external space.

Conversely, if the vertical angle of each electromagnetic horn is wide, the wave plane of radiated microwave is distorted, so that the gradually changing effect of characteristic impedance by the electromagnetic horn is no longer obtainable and the microwave radiation efficiency is deteriorated.

The present inventors have installed pyramidal electromagnetic horn antennas each 30 mm long respectively into four slots formed in an annular waveguide, then installed a reaction chamber constituted by a quartz tube, the quartz tube being concentric with the annular waveguide and with reduced-pressure argon gas sealed therein, and conducted a microwave radiation experiment. As a result, at a horn angle of 20°, there was not attained effective microwave radiation and it was impossible to generate plasma in the quartz tube. At a vertical angle of 30° there was attained effective microwave radiation and it was possible to generate plasma.

Next, under the same conditions as above, each electromagnetic horn was formed to have a vertical angle of 120°. As a result, there was not attained effective microwave radiation, nor was it possible to generate plasma in the quartz tube. However, when the horn vertical angle was set at 90°, there was performed the radiation of a microwave although the radiation efficiency was poor, and it was possible to generate plasma.

Thus, it turned out that plasma could be generated at a vertical angle in the range of 30° to 90°.

Next, the present inventors have conducted the same experiment as above while setting the vertical angle of each electromagnetic horn at 53°. As a result, there was attained a satisfactory radiation of microwave and sufficient plasma could be generated. The plasma obtained under this vertical angle condition was the strongest.

Therefore, an optimal vertical angle condition is in the range of 50° to 60°.

Further, in the present invention it is preferable that a heat insulating material be provided between the cooler and the reaction chamber.

With such a heat insulating material, it is possible to further improve the cooling performance for the annular waveguide. The heat insulating material may be disposed not only between adjacent electromagnetic horns but also in front of each horn if a material difficult to absorb a microwave is selected as the heat insulating material.

If the reaction chamber itself is made a substrate tube, it is possible to form a film on an inner surface of the substrate tube, and thus the substrate tube can be made a preform of optical fiber.

In this case it is preferable that the substrate tube and the annular waveguide be provided relatively movably in the axial direction.

According to this construction, the substrate tube can be made long.

According to the present invention, since the cooler is disposed between the annular waveguide and the reaction chamber, it is possible to prevent overheating of the annular waveguide. Besides, since each antenna is formed as an electromagnetic horn antenna which is wider in the slot spot area toward the reaction chamber, a lowering in radiation efficiency of a microwave is prevented.

BEST MODE FOR CARRYING OUT THE INVENTION

Embodiments of the present invention will be described hereinunder with reference to the accompanying drawings.

Figure 1:
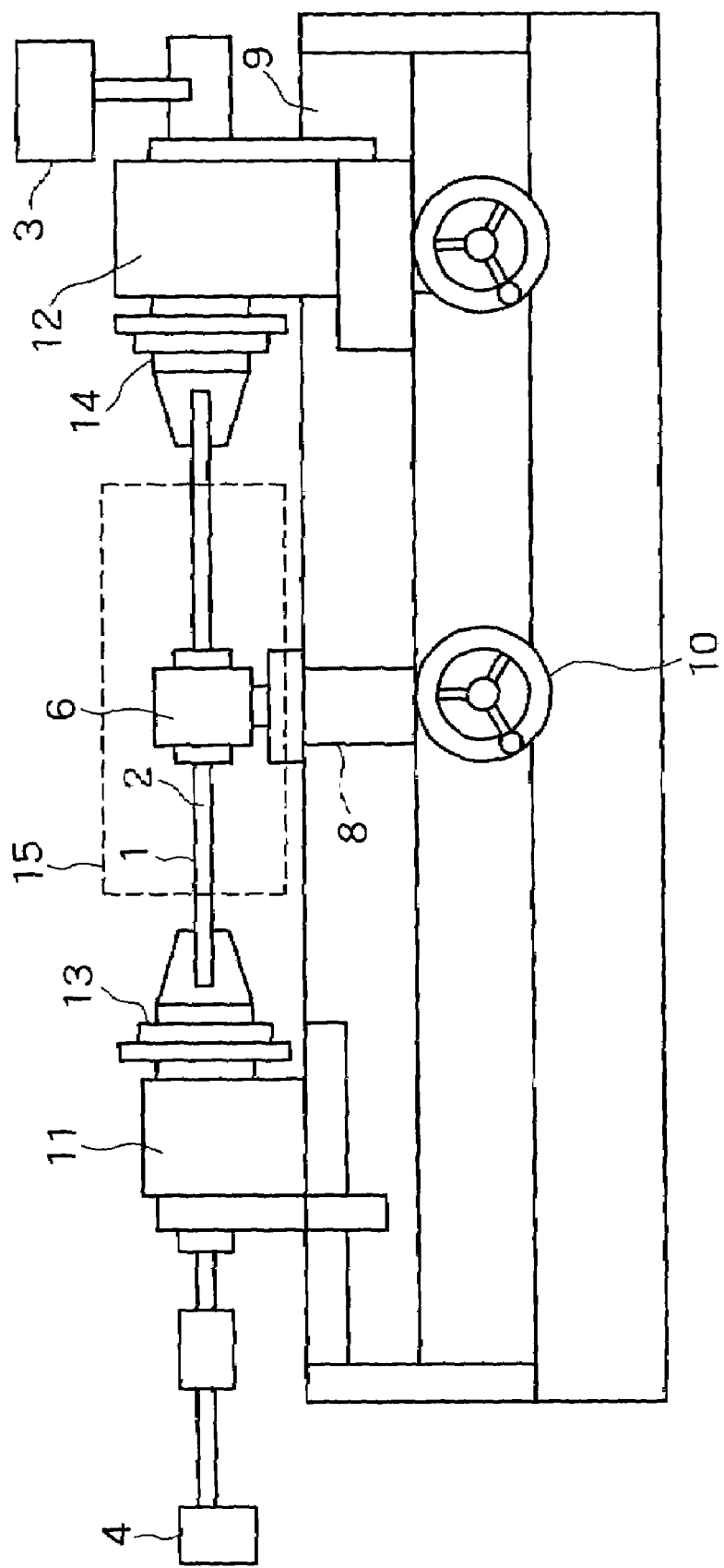
FIG. 1 is a side view of a plasma-activated CVD system according to an embodiment of the present invention.
Figure 2:
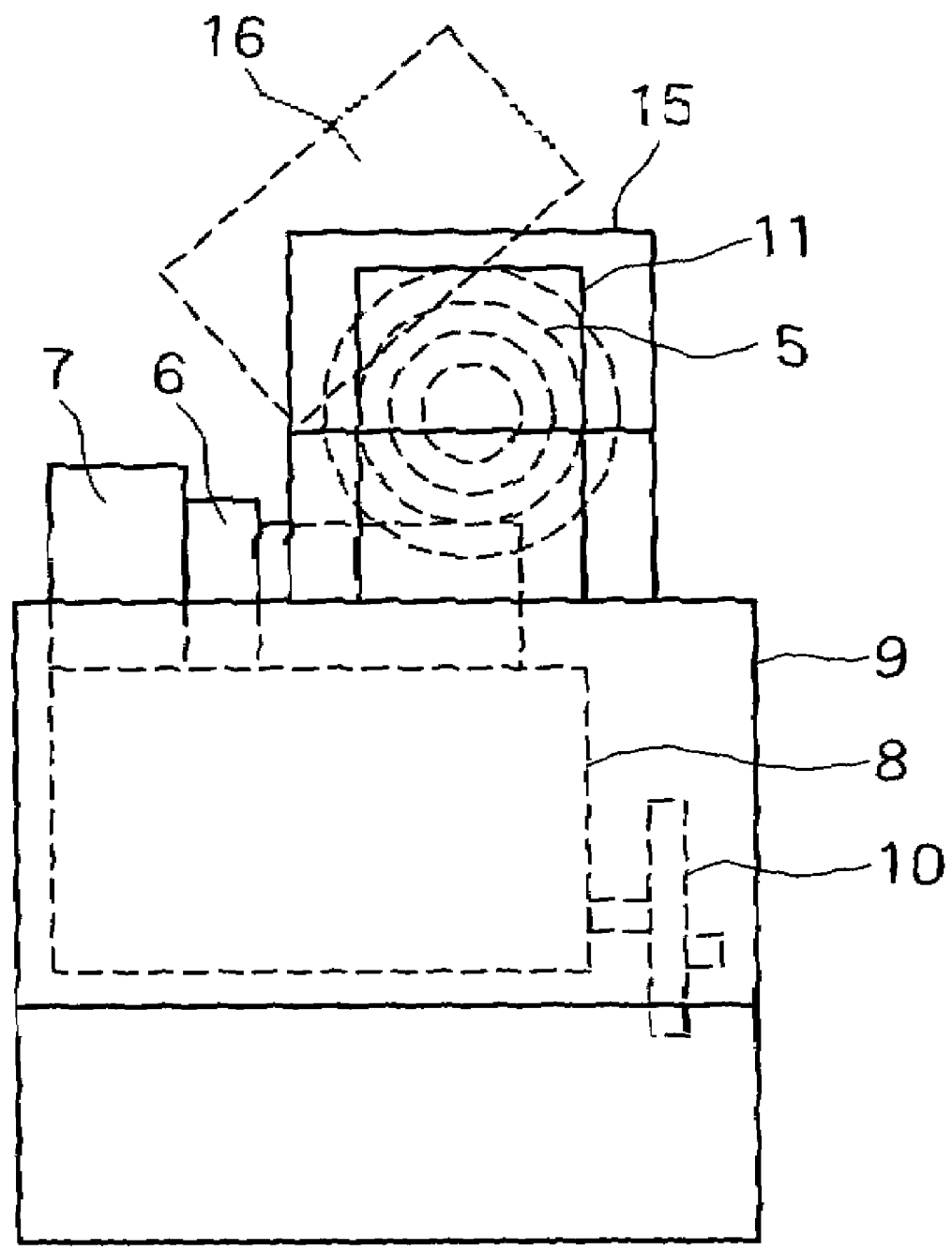
FIG. 2 is a front view of FIG. 1.

A plasma-activated CVD system shown in FIGS. 1 and 2 is for producing an optical fiber, in which a silica-based material for example is deposited on an inner surface of a quartz tube 1 to form a film.

The plasma-activated CVD system is provided with a pressure reducing means 3 for reducing the pressure of a hollow portion 2 of the quartz tube 1, a gas supply means 4 for the supply of gas to the hollow portion 2, and an annular waveguide 5 which radiates a microwave from an outer periphery side of the quartz tube 1 to generate plasma of the gas present within the hollow portion 2, thereby forming a film on an inner surface of the hollow portion 2.

In this embodiment, the hollow portion 2 of the quartz tube 1 is used as a reaction chamber and the quartz tube 1 itself is used as a substrate tube, with a film being formed on an inner surface of the substrate tube. The quartz tube 1 has a diameter of 20 mm to 30 cm and a length of 1 to 2 m.

The annular waveguide 5 is connected to a microwave generating magnetron 7 through an isolator 6 which is for absorbing a reflected microwave, and constitutes a microwave radiation system.

In order to prevent the magnetron 7 from being damaged by a microwave which a load reflects, the isolator 6 is adapted to absorb the reflected microwave by water load, and to this end there is provided a water cooling mechanism in addition to the magnetron 7. This cooling mechanism may be an air cooling type.

The annular waveguide 5 is provided on a moving base 8 which is installed in a bed 9 so as to be movable in the right and left direction.

The isolator 6, the magnetron 7, and a waveguide for connection of the two, other than the annular waveguide 5, are also provided on the moving base 8. Therefore, these components are minimized in weight so as to be small in moving energy.

The moving base 8 is made not only movable in the right and left direction with a manual handle 10 but also movable by a drive unit such as a motor. Moving speed and distance of the moving bed 8 can be controlled by a controller. It is preferable that the moving base 8 be controlled by a personal computer or a sequencer to control moving speed, moving acceleration, and moving distance in an arbitrary manner. The moving base 8 and the associated components constitute a moving device for the annular waveguide 5.

At one end portion of the bed 9 there is provided a head stock 11 movably, while at an opposite end of the bed is provided a tail stock 12 so as to be movable in the right and left direction.

A chuck 13 is supported rotatably by the head stock 11 and one end portion of the quartz tube 1 is connected removably to the chuck 13. Likewise, a chuck 14 is rotatably supported by the tail stock 12 and an opposite end portion of the quartz tube 1 is connected removably to the chuck 14. Both chucks 13 and 14 are rotated forward and reverse synchronously. The chucks 13 and 14, whose rotating speed is controlled by a controller, constitute a rotating device for the quartz tube 1.

Further, the gas supply means 4 is connected to the head stock 11 and the pressure reducing means 3 is connected to the tail stock 12. Both end portions of the quartz tube 1 are chucked by both chucks 13 and 14 in the head stock 11 and the tail stock 12, and in this state the hollow portion 2 of the quartz tube 1 can communicate with both gas supply means 4 and pressure reducing means 3 while maintaining a hermetically sealed state from the exterior.

Although in the above description the gas supply means 4 and the pressure reducing means 3 are connected to the head stock 11 and the tail stock 12, respectively, the connection may be made opposite, that is, the pressure reducing means 3 and the gas supply means 4 may be connected to the head stock 11 and the tail stock 12, respectively. Even in such an opposite connection there can be attained the same effect as above.

The pressure reducing means 3 is constituted mainly by a vacuum pump and maintains the pressure of the hollow portion 2 of the quartz tube 1 in a reduced state. Since there sometimes is used a metal corroding gas such as a chloric gas, the pressure reducing means 3 is constituted so as not be corroded by such a gas.

The gas supply means 4 supplies a necessary reactive gas according to the type of a film to be formed on the inner surface of the hollow portion 2 of the quartz tube 1, e.g., $SiCl_4+O_2$, $SiCl_4+GeCl_4+O_2$, or $SiCl_4+O_2+C_2F_6$.

On the bed 9 is installed a furnace device 15 so as to cover the quartz tube 1 which is chucked by both chucks 13 and 14 and also cover the annular waveguide 5. The furnace device 15 has a lid 16 which can be opened and closed. Removal of the quartz tube 1 can be done by opening the lid 16.

Figure 3:
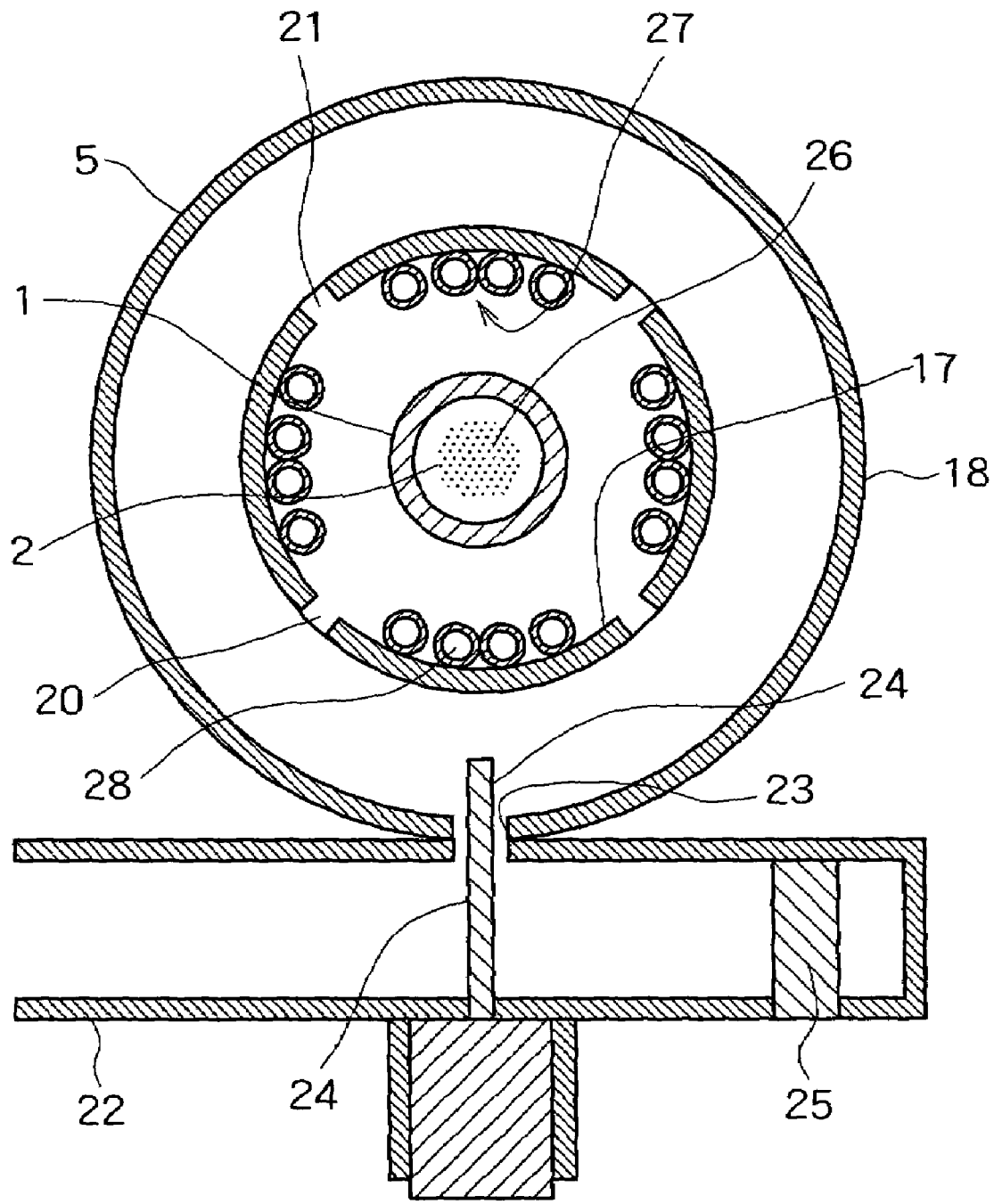
FIG. 3 is a sectional view of an annular waveguide.
Figure 4:
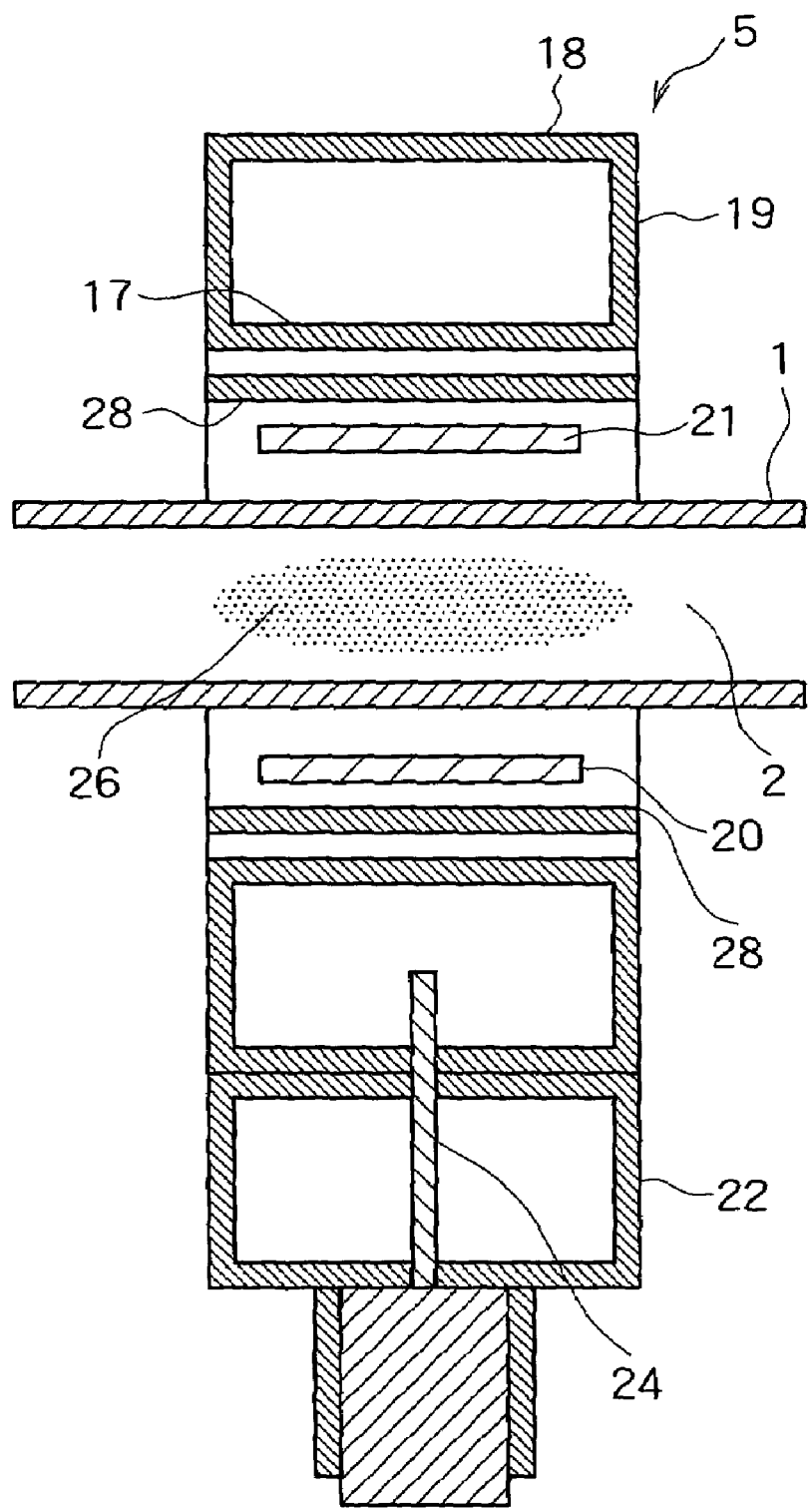
FIG. 4 is a sectional view of FIG. 3.

As shown in FIGS. 3 and 4, the annular waveguide 5 comprises an annular inner periphery wall 17, an annular outer periphery wall 18, the walls 17 and 18 being concentric with each other, and right and left side walls 19. Between the inner and outer periphery walls 17, 18 is formed an annular space for the propagation of electromagnetic power of a microwave.

Antennas 20 for the supply of electromagnetic power of a microwave is provided in the inner periphery portion of the annular waveguide 5.

The antennas 20 are constituted by four slots 21 formed at equal intervals in the circumferential direction of the inner periphery wall 17. Each slot 21 is formed by a rectangular hole which is open in parallel with the axis of the quartz tube 1.

The annular waveguide 5 and the isolator 6 are connected together through a square pipe-like waveguide 22. More specifically, the outer periphery wall 18 of the annular waveguide 5 and one side wall of the waveguide 22 are connected together through a communicating portion 23, and a coupling antenna 24 is disposed in the communicating portion 23.

A microwave of 2.45 GHz, which is fed through the magnetron 7 and the isolator 6, is propagated through the waveguide 22 up to the coupling antenna 24. Electromagnetic power of the microwave is set at 1~10 kW. The coupling antenna 24 is installed for the purpose of coupling the waveguide 22 and the annular waveguide 5 electromagnetically. A metallic rod formed using a material superior in electric conductivity is disposed in such a form as pieces between the waveguide 22 and the annular waveguide 5. An insertion depth of the coupling antenna 24 can be changed manually or automatically. That is, the reflection of the microwave is changed by the coupling antenna, whereby it is made possible to adjust the state of matching of the microwave or arbitrarily change the state of coupling between the microwave present within the waveguide 22 and that present within the annular waveguide 5.

In this embodiment, in order to take matching of the microwave, a movable plunger tuner 25 formed by an electrically conductive metal is provided in a terminal end portion of the waveguide 22, in addition to the coupling antenna 24. The position of the movable plunger 25 can be changed manually or automatically.

It suffices for a movable position changing range of the movable plunger 25 to be half or more of a guide wavelength of the microwave, but for the convenience of adjustment it is more preferable that the said range be from half to one-wavelength.

Matching of the microwave is taken by both movable plunger 25 and coupling antenna 24. The state of matching of the microwave can be checked by both an electromagnetic power of the microwave outputted from the magnetron 5 and that of the reflected microwave traveling back to the isolator 6. It seen that the smaller the reflected power in comparison with the output power of the microwave, the better the matching taken. It is preferable that the electromagnetic power of a traveling wave of the microwave and that of a reflected wave of the microwave be measured using a crystal detector for example. However, as to the traveling wave power, it can be estimated from the electromagnetic power fed to the magnetron 7, and as to the reflected wave power, even if the electromagnetic power fed to the isolator 6 is measured, there can be obtained about the same effect.

As long as matching is taken and sufficient electromagnetic power of the microwave is outputted, the microwave is fed from the antennas 20 to the gas present within the quartz tube 1, and if pressure and the type of gas meet predetermined conditions, plasma 26 is generated, a desired chemical reaction proceeds, and a film can be deposited on the inner surface of the quartz tube 1.

In this case, the temperature of the quartz tube 1 heated by the furnace device 15 reaches a maximum of about 1200° C. With this radiant heat, the annular waveguide 5 is heated and the temperature thereof rises.

In the present invention, in order to overcome the above-mentioned problem of overheating, there is provided a cooler 27 for cooling the annular waveguide 5, whereby it is intended to protect the annular waveguide 5 from heat and attain a safe and stable supply of the microwave.

The cooler 27 is disposed between the annular waveguide 5 and the quartz tube 1 as the reaction chamber. To be more specific, a cooling pipe 28 for passing therethrough of a refrigerant such as water, oil, or gas is mounted to an inner surface of the inner periphery wall 17 of the annular waveguide 5, thereby constituting the cooler 27.

The cooling pipe 28 is laid between adjacent slots 21 so as not to close the opening of each slot 21.

As the material of the cooler 27, a material having a melting point of 1200° C. or higher is preferred. This is for the following reason. In an optical fiber fabricating process wherein the temperature reaches a maximum level of 1200° C., in the event the temperature of the annular waveguide 5 should rise to above 1200° C. for some reason, the cooler 27 is to be prevented from being melted and damaged.

The cooler 27 has a cooling capacity to such an extent that the radiant heat from the quartz tube 1, heat which the annular waveguide 5 receives directly from the furnace device 15, and heat which is absorbed due to a microwave loss in the interior of the annular waveguide 5, can be released to the exterior.

For stable radiation of the microwave from the antennas 20 it is necessary to take a characteristic impedance matching sufficiently between the annular waveguide 5 side and the quartz tube 1 when viewed from the antennas 20. The impedance on the quartz tube 1 side is greatly influenced by an external shape of the quartz tube 1 and that of the annular waveguide 5 or by structural members installed on the annular waveguide 5.

In the case where the antennas 20 of the annular waveguide 5 are slot antennas and the cooler 27 is disposed between adjacent slots 21, then if the cooler 27 is fabricated using an electric conductor such as metal, the conductor of the cooler 27 affects the characteristic impedance of the radiation space and thus there is a fear that the microwave radiation efficiency may be deteriorated.

In more particular terms, the characteristic impedance in the interior of the annular waveguide 5 is generally different from the spatial characteristic impedance outside the annular waveguide 5, and in the case of a structure wherein a microwave is radiated to the external space directly from the wall of the waveguide 5, like a slot shape, it is difficult to take matching of characteristic impedance and the microwave which has been propagated through the waveguide 5 is reflected at the positions of the slots and is difficult to be radiated efficiently to the space.

This tendency is strong especially when something which disturbs the characteristic impedance of the radiation space, typical of which is the cooler 27, is disposed near the antennas 20. Further, it is extremely difficult to beforehand calculate matching conditions for stable radiation of the microwave.

Figure 5:
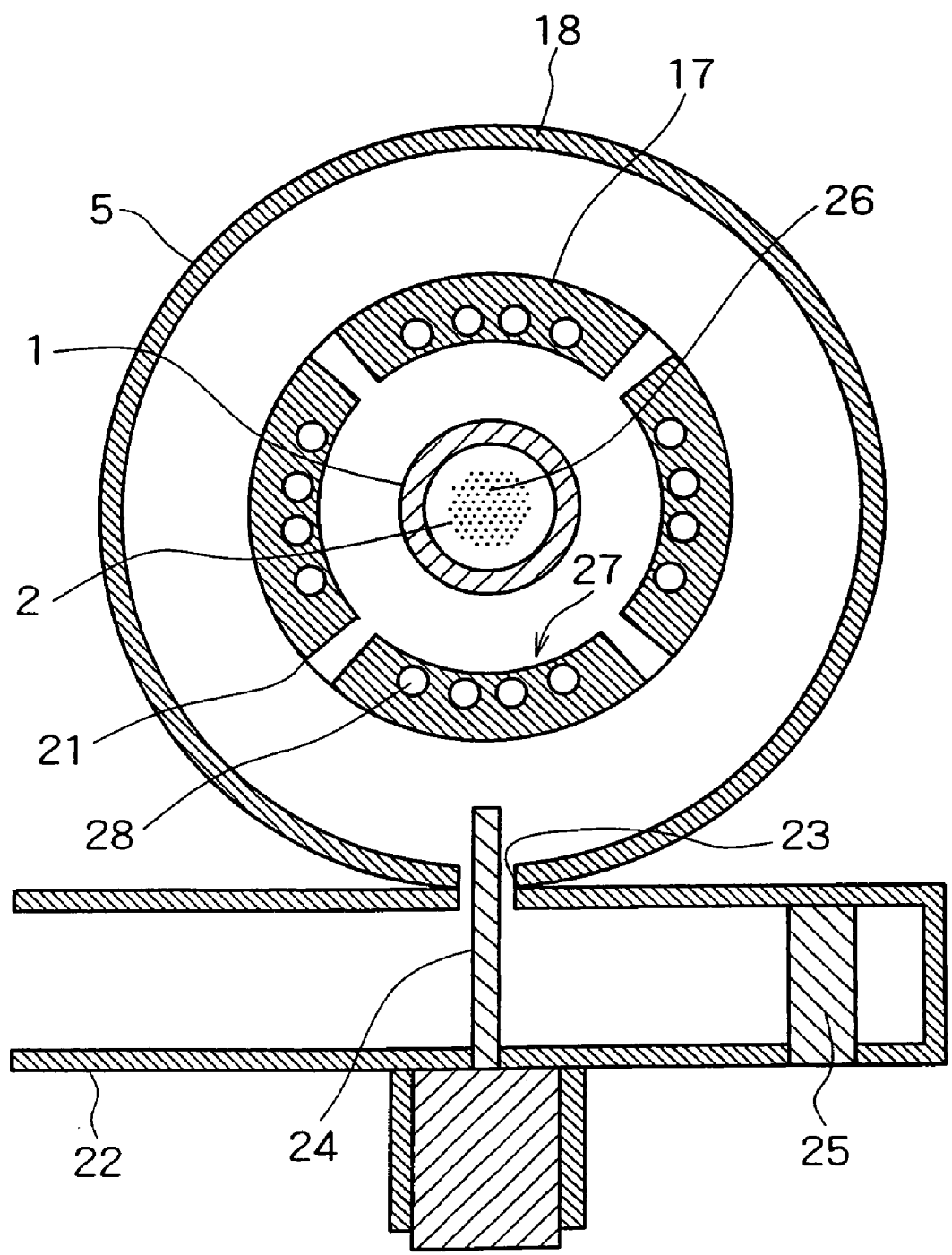
FIG. 5 is a sectional view showing another example of an annular waveguide.
Figure 6:
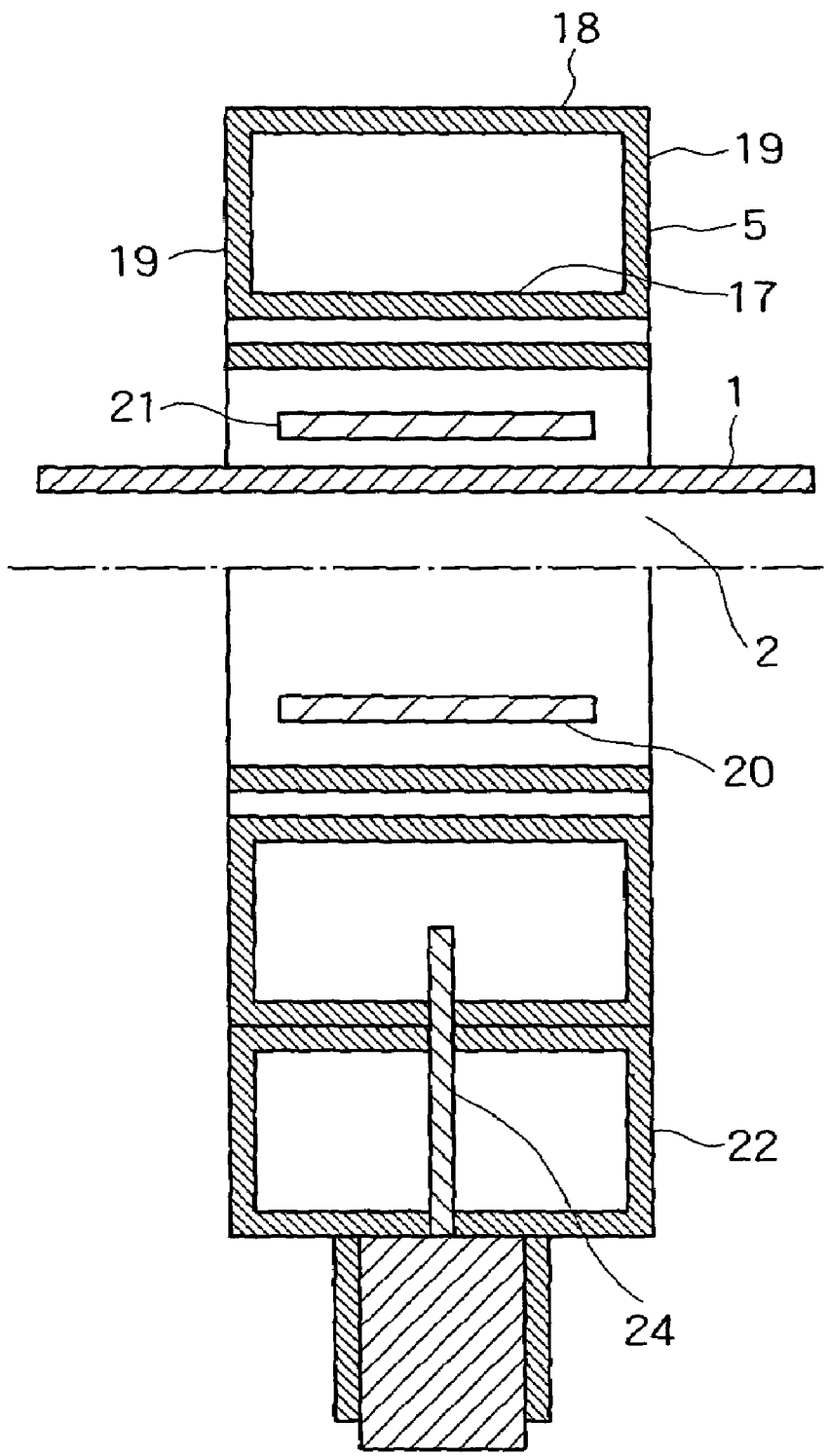
FIG. 6 is a sectional view of FIG. 5.

Therefore, as shown in FIGS. 5 and 6, in order to make the cooler 27 installed inside the annular waveguide 5 difficult to affect the characteristic impedance of the space surrounded with both annular waveguide 5 and quartz tube 1, the cooling pipe 28 is embedded in the inner periphery wall 17 of the annular waveguide 5.

In this case, there arises the necessity of accommodating the cooling pipe 28 within the inner periphery wall 17 of the annular waveguide 5, and therefore the thickness of the inner periphery wall 17 of the annular waveguide 5 becomes thicker inevitably.

With such an increase in thickness of the inner periphery wall 17, it is necessary that in each slot 21 of the antennas 20 the microwave be propagated a longer distance through the narrow space, thus making it extremely difficult to obtain the same radiation characteristic as in the case of the thin inner periphery wall. When slot antennas are formed in such a thick inner periphery wall 17, the microwave is reflected at the positions of the slots 21 and is returned into the annular waveguide 5. Consequently, it becomes difficult for effective microwave radiation to be applied to the quartz tube 1.

Figure 7:
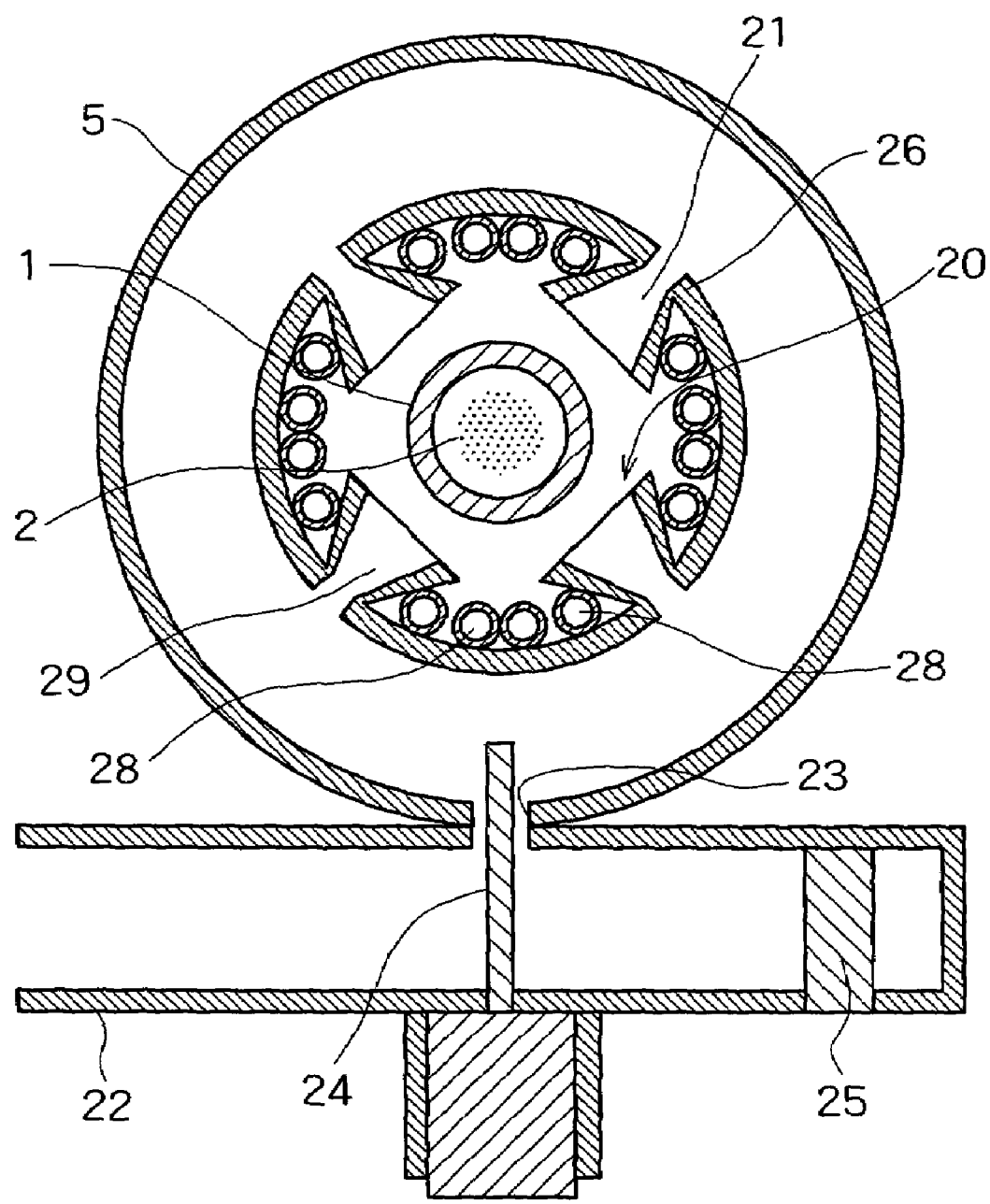
FIG. 7 is a sectional view showing a further example of an annular waveguide.
Figure 8:
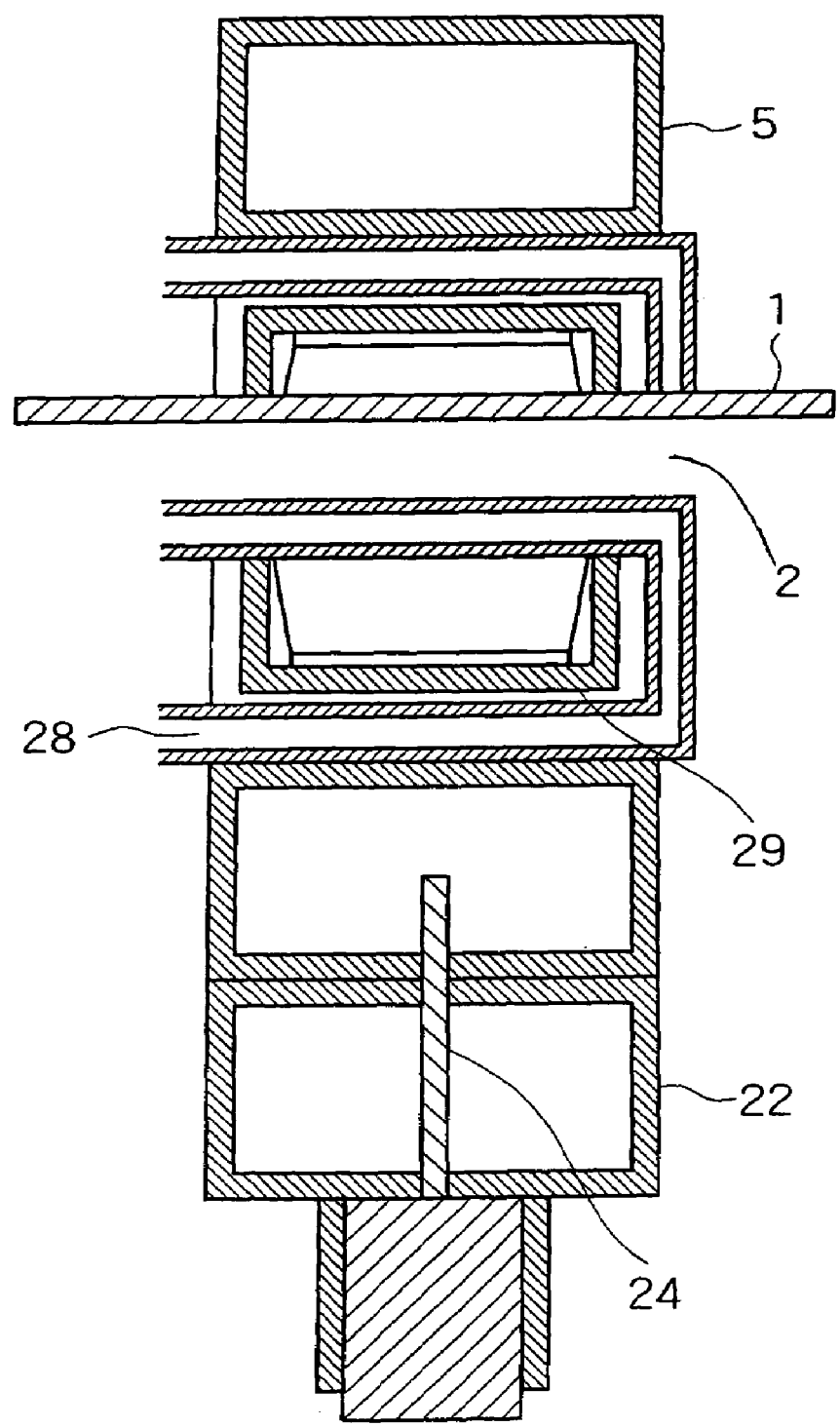
FIG. 8 is a sectional view of FIG. 7.

To avoid such an inconvenience, as shown in FIGS. 7 and 8, the antennas 20 are each formed as an electromagnetic horn antenna 29 of such a shape as the spot area of the associated slot 21 becomes wider gradually. With such a shape, the characteristic impedance is approximated gradually to the characteristic impedance of the space and finally there is taken a characteristic impedance matching between the slots 21 formed in the inner periphery wall 17 of the annular waveguide 5 and the space.

It is preferable that the electromagnetic horn antenna 29 be formed of a material superior in electrical conductivity, provided the surface thereof may be plated with a metal superior in electrical conductivity such as silver or gold. At a high frequency of 2.45 GHz the plating thickness may be several microns because a skin effect is exhibited.

Figure 9:
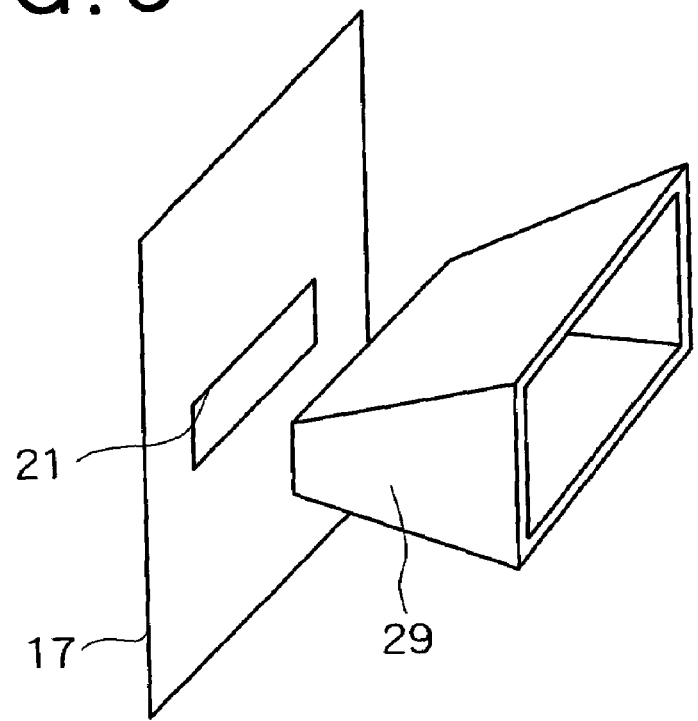
FIG. 9 is an exploded perspective view of an electromagnetic horn antenna.

FIG. 9 shows an example of the shape of the electromagnetic horn antenna 29, which is a pyramidal shape. This shape facilitates fabrication of the antenna and permits installation of a large capacity of cooler 27.

Figure 10:
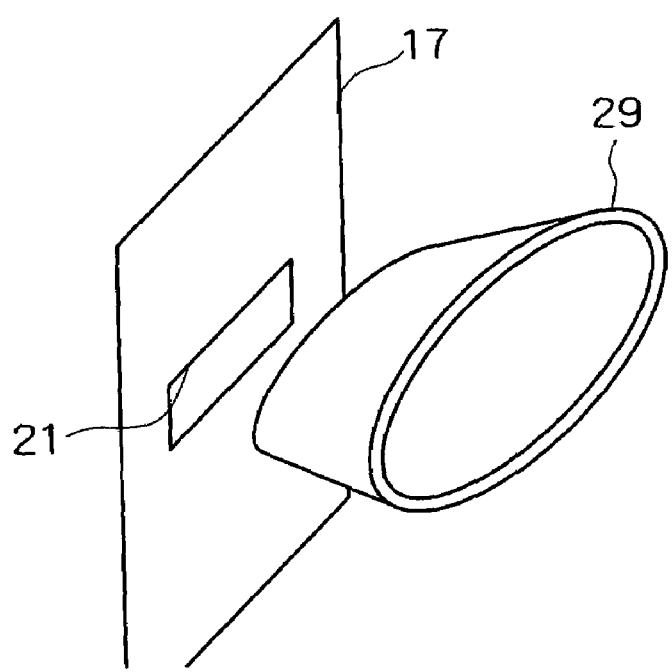
FIG. 10 is an exploded perspective view showing another example of an electromagnetic horn antenna.

As shown in FIG. 10, the electromagnetic horn antenna 29 may be formed in an elliptic shape. With such an elliptic shape, it is possible to make the microwave radiation area elliptic and thereby make the intensity distribution in the same area circular and uniform.

Figure 11:
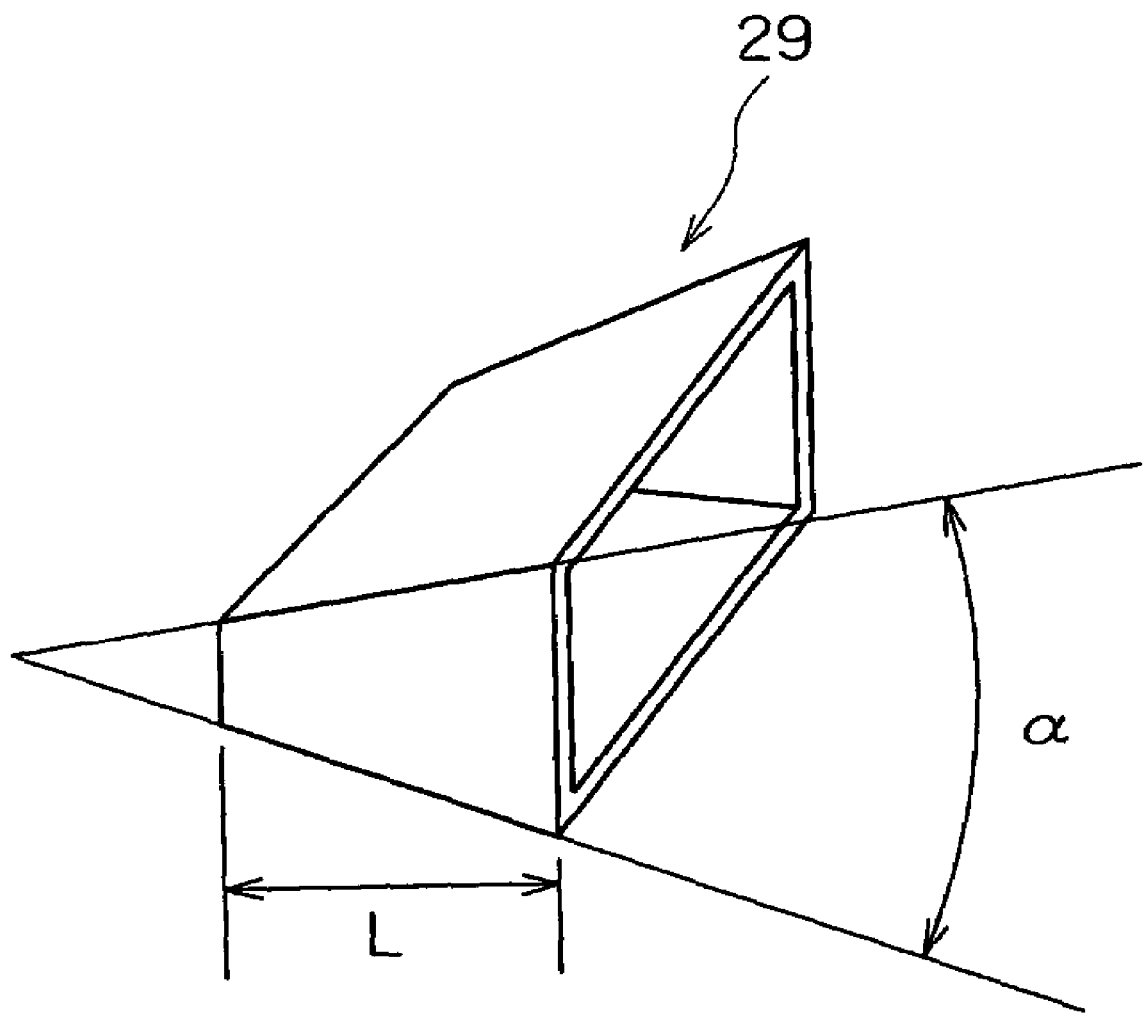
FIG. 11 is a diagram explanatory of a shape of an electromagnetic horn antenna.

In the electromagnetic horn antenna 29, as shown in FIG. 11, the larger the horn length L and the narrower the vertical angle $\alpha$ (divergence angle), the smaller the change in characteristic impedance and the higher the release efficiency.

However, in the case of an electromagnetic horn antenna 29 installed as a substitute for each slot 21 in the annular waveguide 5 about 100 mm in inside diameter, if the vertical angle $\alpha$ is set too small, the spot area becomes smaller, so the propagation of microwave becomes difficult and most of the microwave is reflected into the annular waveguide 5, not released to the external space.

Conversely, if the vertical angle $\alpha$ of the electromagnetic horn antenna 29 is wide, there is not obtained the effect of a spatial change in characteristic impedance by the horn antenna 29 becomes no longer obtainable and the wave front of the microwave radiated from the antenna is distorted, with consequent deterioration of the microwave radiation efficiency.

An experiment was conducted wherein pyramidal electromagnetic horn antennas 29 each having a horn length L of 30 mm were installed respectively in four slots 21 formed in the inner periphery surface 17 of the annular waveguide 5, a reaction chamber 2 constituted by the quartz tube 1 and with a pressure-reduced argon gas sealed therein was located inside the annular waveguide 5, and microwave radiation was supplied. As a result, at a horn angle $\alpha$ of 20° there was not attained any effective microwave radiation and plasma could not be generated in the quartz tube 1. At a vertical angle $\alpha$ of 30° there was attained effective microwave radiation and it was possible to generate useful plasma in the interior of the quartz tube 1.

Next, under the same conditions as above, when the vertical angle $\alpha$ of the electromagnetic horn antenna was set at 120°, impedance matching was difficult to obtain and it was impossible to generate plasma sufficiently. When the vertical angle $\alpha$ was set at 90°, there was performed a sufficient radiation of microwave and the generation of useful plasma in the quartz tube 1 was confirmed.

Next, the same experiment as above was conducted except that the vertical angle $\alpha$ of the electromagnetic horn antenna was set at 53°. As a result, microwave radiation could be attained in the state of a minimum reflected power and plasma could be generated sufficiently.

The results thus obtained can be interpreted as follows.

The electromagnetic horn antenna 29 is a kind of an spot antenna typical of which is a parabola antenna, and it is known that the larger the spot area, the more sharp the directivity and there is obtained a high gain. Thus, if the vertical angle $\alpha$ is small, the spot area becomes smaller, so that the gain decreases and the microwave radiation efficiency is deteriorated. Of course, if the length L of the electromagnetic horn antenna 29 is made large, it is possible to make the spot area large even at a small vertical angle $\alpha$, but the length L of the electromagnetic antenna 29 is limited inevitably by the inside diameter of the annular waveguide 5 and the outside diameter of the quartz tube 1. On the other hand, if the vertical angle $\alpha$ is set large, the directivity is improved and the gain also tends to increase. However, if the vertical angle $\alpha$ is set too large, the wave front of the microwave released from the electromagnetic horn antenna 29 is distorted and the radiation efficiency of the antenna is deteriorated.

Thus, the length L of the electromagnetic horn antenna 29 is determined inevitably by the system configuration, and at this determined length L there is determined a vertical angle $\alpha$ corresponding to the highest antenna radiation efficiency.

According to experiments, at a length L of 30 mm, an optimal vertical angle α is 53°, but effective microwave radiations were confirmed in a vertical angle range of 30° to 90°.

It is preferable that an appropriate vertical angle α of the electromagnetic horn antenna 29 be determined in view of the cooling capacity required of the cooler 27, i.e., the volume of the cooler 27, and the microwave radiation efficiency of the horn antenna 29.

Figure 12:
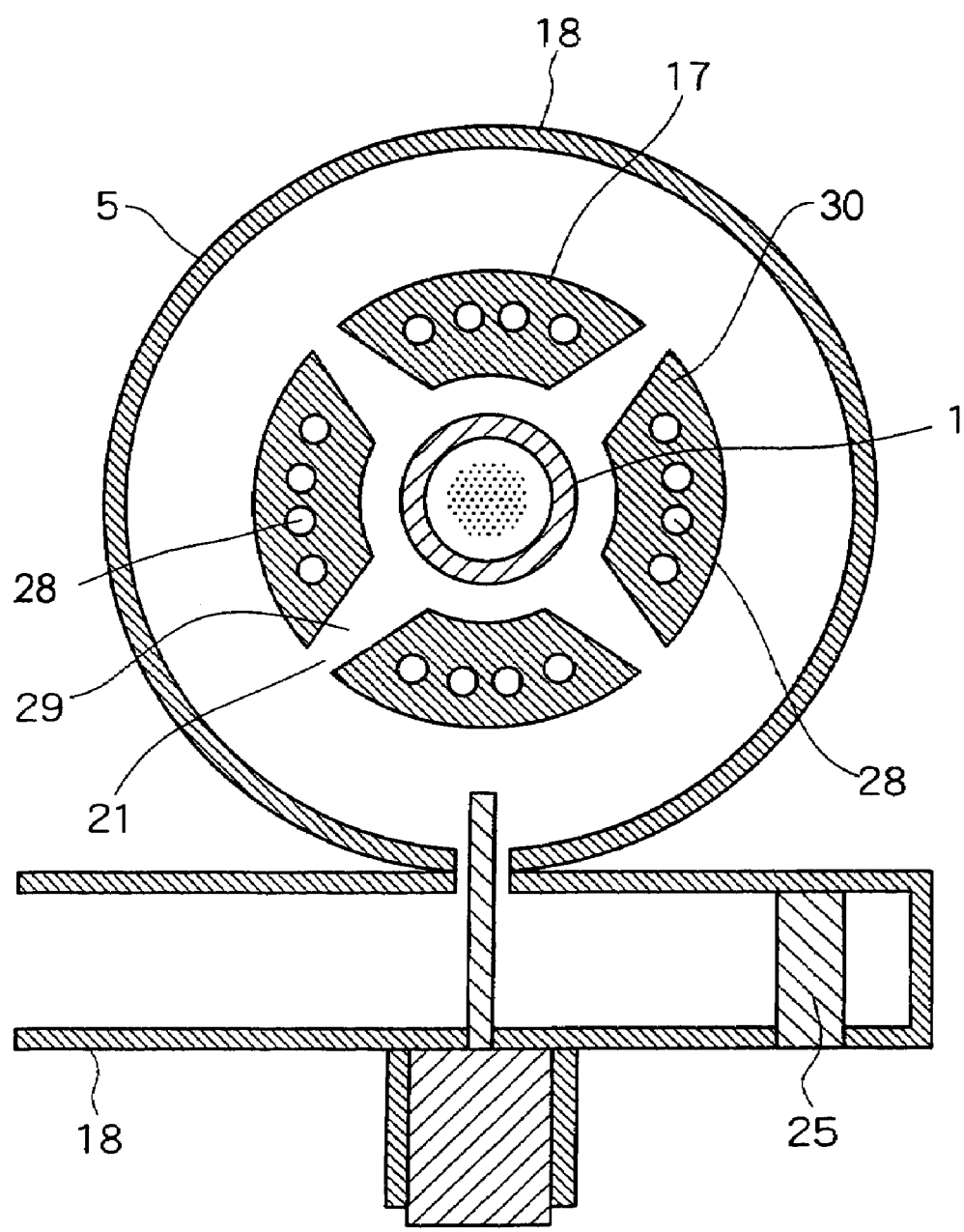
FIG. 12 is a sectional view showing a further example of an annular waveguide.
Figure 13:
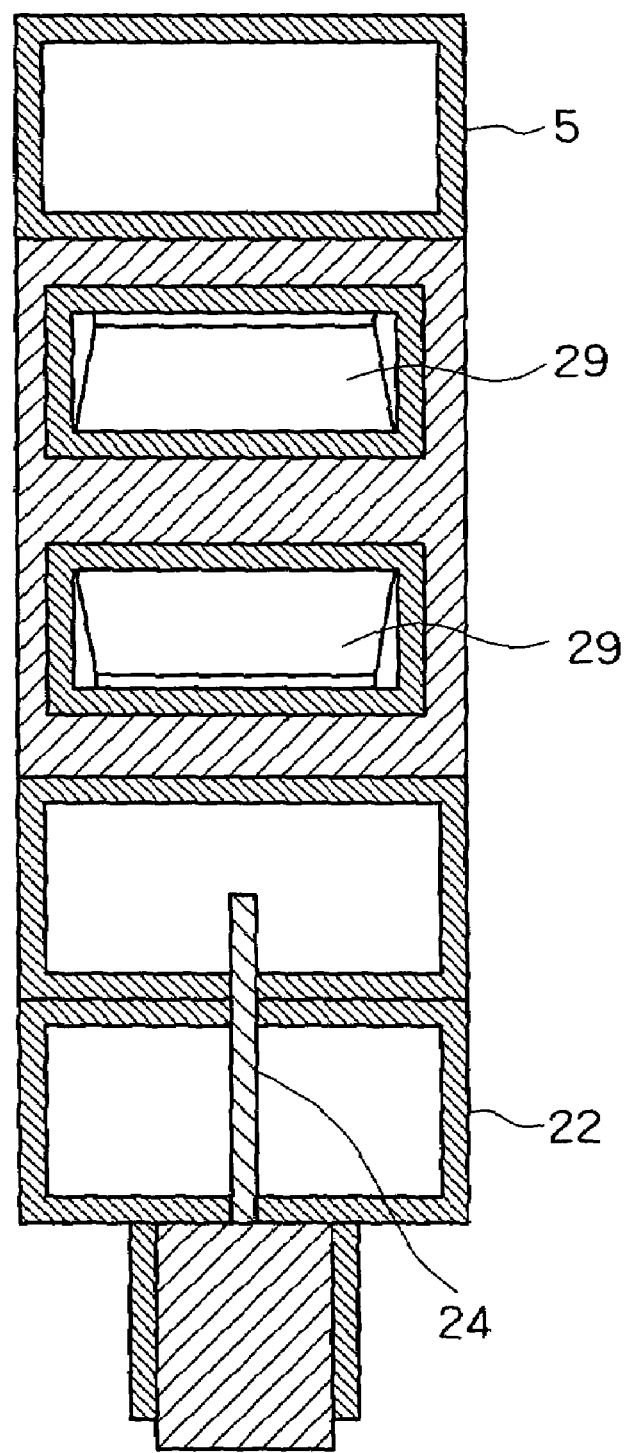
FIG. 13 is a sectional view of FIG. 12.

In FIGS. 12 and 13, the cooling pipe 28 mounted to the inner periphery wall 17 of the annular waveguide 5 is embedded in a material 30 superior in thermal conductivity and electrical conductivity, e.g., a metal such as stainless steel, and the face opposed to the quartz tube 1 is made smooth and subjected to a processing for improving the microwave reflecting characteristic such as specular polishing. With this construction, a further improvement of the microwave release characteristic can be expected.

Figure 14:
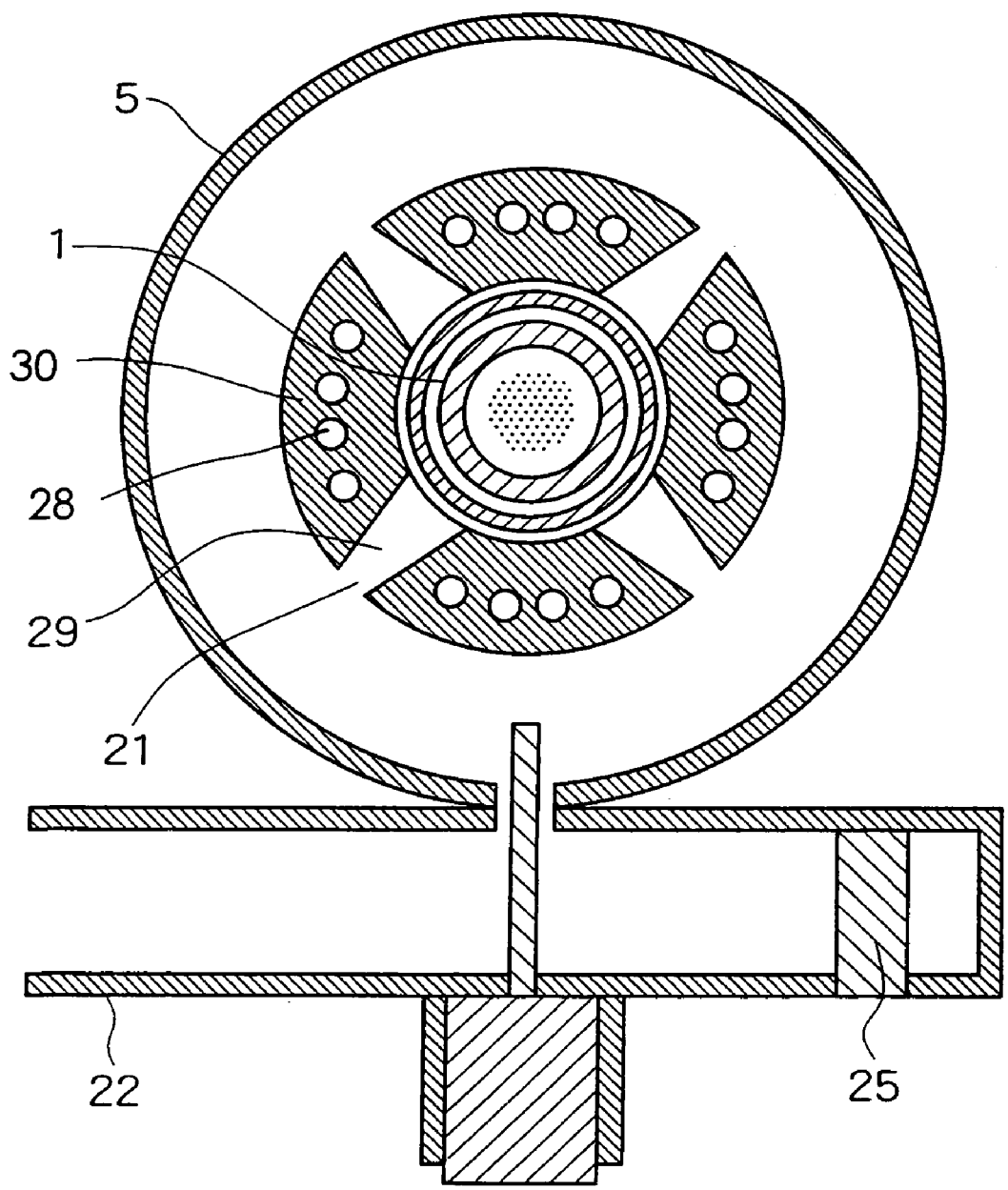
FIG. 14 is a sectional view showing a further example of an annular waveguide.
Figure 15:
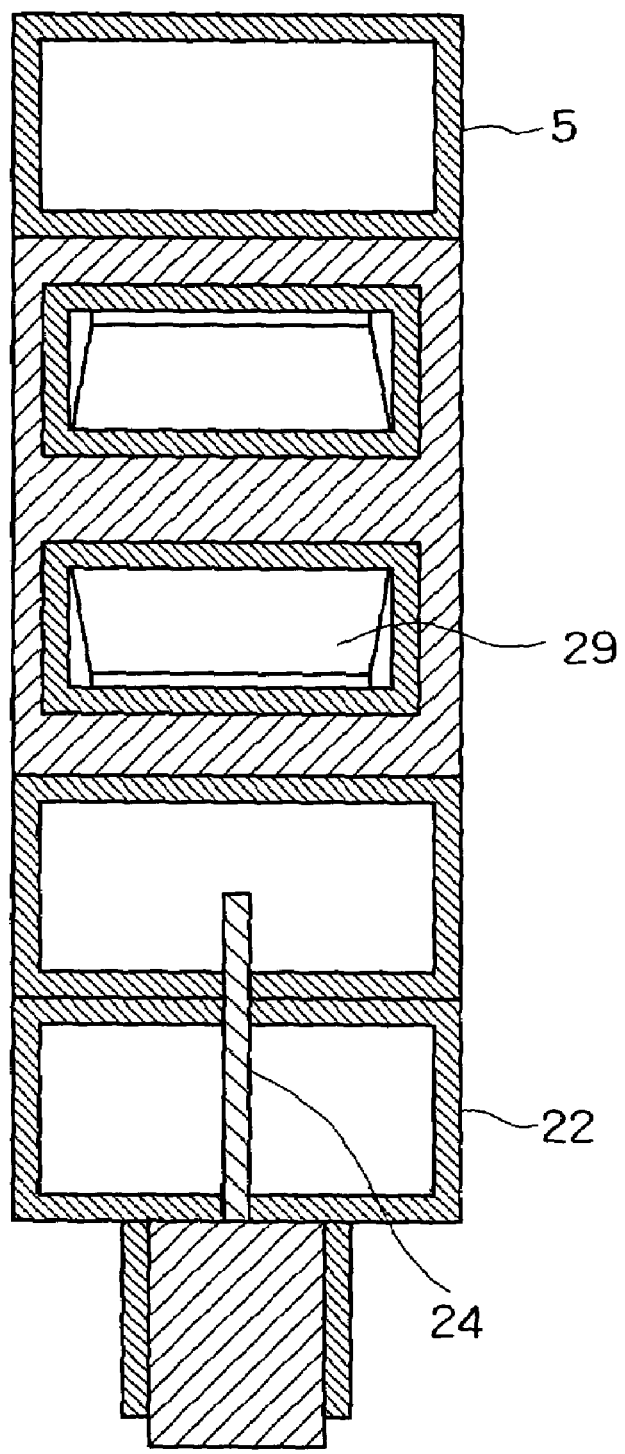
FIG. 15 is a sectional view of FIG. 14.

In FIGS. 14 and 15, a heat insulating material 30 is disposed between the quartz tube 1 and the annular waveguide 5.

Even with the cooler 27, if the radiation from the quartz tube 1 is large and the temperature of the annular waveguide 5, as well as the temperatures of the electromagnetic horn antennas 29 and the cooler 27, become high, the provision of the insulating material 30 between the quartz tube 1 and the annular waveguide 5 permits a further improvement in cooling performance of the annular waveguide 5.

If a material difficult to absorb the microwave is selected as the insulating material 30, the same material can be disposed not only between the electromagnetic horn antennas 29 but also on the front side of the horn antennas 29.

The present invention is not limited to the above embodiments, but is also applicable to the system of the foregoing prior art 2.

INDUSTRIAL APPLICABILITY

The plasma-activated CVD system of the present invention is used for example in inner surface processing and film formation for a quartz tube of an optical fiber preform.

What is claimed is:

1. A plasma-activated CVD system including:
   an annular waveguide comprising an outer annular wall and an inner annular wall;
   a reaction chamber disposed in said waveguide:
   antenna slots provided in an inner periphery wall of said annular waveguide; and
   a cooler disposed between an outer surface of the inner periphery wall of said annular waveguide and said reaction chamber, the cooler being arranged between adjacent antenna slots;
   wherein electromagnetic power of a microwave is fed from said antenna slots into said reaction chamber, to allow plasma to be generated in the interior of said reaction chamber, and to form a film by a vapor deposition method.

2. The plasma-activated CVD system according to claim 1, wherein said antennas include slots formed in the inner periphery portion of said annular waveguide at predetermined intervals in the circumferential direction.

3. The plasma-activated CVD system according to claim 2, wherein said antennas include electromagnetic horn antennas in each of which a spot area of associated said slot is wider toward said reaction chamber.

4. The plasma-activated CVD system according to claim 3, wherein said electromagnetic horn antennas are each in a pyramidal shape.

5. The plasma-activated CVD system according to claim 4, wherein a vertical angle of the cone of each said pyramidal electromagnetic horn antenna is in the range of 30 to 90 degrees.

6. The plasma-activated CVD system according to claim 4, wherein a vertical angle of the cone of each said pyramidal electromagnetic horn antenna is in the range of 50 to 60 degrees.

7. The plasma-activated CVD system according to claim 1, wherein a heat insulating material is disposed between said cooler and said reaction chamber.

8. The plasma-activated CVD system according to claim 1, wherein said reaction chamber is a substrate tube and a film is formed on an inner surface of said substrate tube.

9. The plasma-activated CVD system according to claim 1, wherein said reaction chamber is a substrate tube, and said substrate tube and said annular waveguide are movable axially relatively.

10. The plasma-activated CVD system according to claim 1, wherein said reaction chamber is a substrate tube, said substrate tube being an optical fiber preform.

11. The plasma-activated CVD system according to claim 2, wherein a heat insulating material is disposed between said cooler and said reaction chamber.

12. The plasma-activated CVD system according to claim 3, wherein a heat insulating material is disposed between said cooler and said reaction chamber.

13. The plasma-activated CVD system according to claim 4, wherein a heat insulating material is disposed between said cooler and said reaction chamber.

14. The plasma-activated CVD system according to claim 5, wherein a heat insulating material is disposed between said cooler and said reaction chamber.

15. The plasma-activated CVD system according to claim 6, wherein a heat insulating material is disposed between said cooler and said reaction chamber.

16. The plasma-activated CVD system according to claim 2, wherein said reaction chamber is a substrate tube and a film is formed on an inner surface of said substrate tube.

17. The plasma-activated CVD system according to claim 3, wherein said reaction chamber is a substrate tube and a film is formed on an inner surface of said substrate tube.

18. The plasma-activated CVD system according to claim 4, wherein said reaction chamber is a substrate tube and a film is formed on an inner surface of said substrate tube.

19. The plasma-activated CVD system according to claim 5, wherein said reaction chamber is a substrate tube and a film is formed on an inner surface of said substrate tube.

20. The plasma-activated CVD system according to claim 6, wherein said reaction chamber is a substrate tube and a film is formed on an inner surface of said substrate tube.

21. The plasma-activated CVD system according to claim 2, wherein said reaction chamber is a substrate tube, and said substrate tube and said annular waveguide are movable axially relatively.

22. The plasma-activated CVD system according to claim 3, wherein said reaction chamber is a substrate tube, and said substrate tube and said annular waveguide are movable axially relatively.

23. The plasma-activated CVD system according to claim 4, wherein said reaction chamber is a substrate tube, and said substrate tube and said annular waveguide are movable axially relatively.

24. The plasma-activated CVD system according to claim 5, wherein said reaction chamber is a substrate tube, and said substrate tube and said annular waveguide are movable axially relatively.

25. The plasma-activated CVD system according to claim 6, wherein said reaction chamber is a substrate tube, and said substrate tube and said annular waveguide are movable axially relatively.

26. The plasma-activated CVD system according to claim 2, wherein said reaction chamber is a substrate tube, said substrate tube being an optical fiber preform.

27. The plasma-activated CVD system according to claim 3, wherein said reaction chamber is a substrate tube, said substrate tube being an optical fiber preform.

28. The plasma-activated CVD system according to claim 4, wherein said reaction chamber is a substrate tube, said substrate tube being an optical fiber preform.

29. The plasma-activated CVD system according to claim 5, wherein said reaction chamber is a substrate tube, said substrate tube being an optical fiber preform.

30. The plasma-activated CVD system according to claim 6, wherein said reaction chamber is a substrate tube, said substrate tube being an optical fiber preform.

31. The plasma-activated CVD system according to claim 1, wherein said cooler comprising a material having a melting point of at least 1200° C.

32. The plasma-activated CVD system according to claim 1, wherein said cooler comprises a water-based refrigerant.

33. The plasma-activated CVD system according to claim 1, wherein said cooler comprises an oil-based refrigerant.

34. The plasma-activated CVD system according to claim 1, wherein said cooler comprises a gaseous refrigerant.

35. The plasma-activated CVD system according to claim 1, wherein the cooler comprising cooling pipes oriented parallel to an axis of said annular waveguide.

* * * * *